US007349248B2

(12) United States Patent
Kawazu et al.

(10) Patent No.: US 7,349,248 B2
(45) Date of Patent: Mar. 25, 2008

(54) NON-VOLATILE MEMORY

(75) Inventors: Yoshiyuki Kawazu, Saitama (JP); Hiroyuki Tanaka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/656,934

(22) Filed: Jan. 24, 2007

(65) Prior Publication Data

US 2007/0258285 A1 Nov. 8, 2007

(30) Foreign Application Priority Data

Apr. 11, 2006 (JP) ............................ 2006-108408

(51) Int. Cl.
*G11C 11/36* (2006.01)

(52) U.S. Cl. ...................... 365/175; 257/910; 257/191; 257/E29.33; 257/E29.17

(58) Field of Classification Search ................ 257/910, 257/391, E29.33, E29.17; 365/175
See application file for complete search history.

(56) References Cited

U.S. PATENT DOCUMENTS 6,034,882 A 3/2000 Johnson et al.
7,071,533 B1 * 7/2006 Kimber et al. .............. 257/529
2004/0245522 A1 * 12/2004 VanBuskirk et al. .......... 257/40
2006/0073642 A1 * 4/2006 Yeh et al. ................... 438/132
2006/0199361 A1 * 9/2006 Ho et al. .................... 438/597

FOREIGN PATENT DOCUMENTS

WO WO-00/30118 5/2000

* cited by examiner

*Primary Examiner*—Minhloan Tran
*Assistant Examiner*—Eric A Bomkamp
(74) *Attorney, Agent, or Firm*—Rabin & Berdo, PC

(57) ABSTRACT

A non-volatile memory cell includes an upper electrode; a lower electrode and a state-variable region, in which a conductive state changes only once. The state variable region is formed in a region between the upper electrode and the lower electrode. The state-variable region comprises a first semiconductor layer of a first conductive type; and second semiconductor layers of a second conductive type, opposing to the first conductive type, which are formed on upper and lower surfaces of the first semiconductor layer via PN junctions.

9 Claims, 7 Drawing Sheets

STATE "0"
STATE "1"
STATE "3"
STATE "4"

*Fig. 4*

| | UPPER ELECTRODE 3: +3V<br>LOWER ELECTRODE 4: ±0V | UPPER ELECTRODE 3: ±0V<br>LOWER ELECTRODE 4: +3V |
|---|---|---|
| STATE "0" | OFF | OFF |
| STATE "1" | ON | OFF |
| STATE "2" | OFF | ON |
| STATE "3" | ON | ON |

NON-VOLATILE MEMORY

CROSS REFERENCE TO RELATED APPLICATION

This application claims the priority of Application No. 2006-108408, filed on Apr. 11, 2006 in Japan, the subject matter of which is incorporated herein by reference.

TECHNICAL FIELD OF THE INVENTION

The present invention relates to a non-volatile semiconductor memory, in which stored data is maintained even after turning off the power. Such a memory is called an OTP (One Time Programmable) memory, having a state-variable region which can be changed in state one time and is irreversible.

BACKGROUND OF THE INVENTION

A non-volatile memory is a kind of semiconductor memory devices. Such a non-volatile memory includes a mask ROM and a field-programmable-memory. A mask ROM is a memory in which data are written once in a manufacturing process and cannot be deleted semi-permanently. On the other hand, field-programmable memory is categorized by one of a volatile memory, in which one time wiring is possible, and a non-volatile memory, in which operations of reading, deleting and re-writing are possible. A memory with a function of single writing operation is called a PROM (Programmable ROM) or OTPROM (One Time Programmable ROM). Also there are other types of semiconductor memory devices, UVEPROM (Ultraviolet Erasable Programmable ROM), EEPROM (Electrically Erasable Programmable ROM) and flash EEPROM (high-speed flexible EEPROM).

A mask ROM has an advantage of manufacturing cost. However, a mask ROM has disadvantages in that it takes a long time to deliver to a user since the user orders it because program data are written in a fabrication process and it takes a longer period of time to treat program bugs. On the other hand, a field-programmable memory has an advantage in that it takes shorter period of time to treat program bugs, and therefore, it takes shorter period of time to deliver to a user since the user orders it. For that reason, these days, field programmable memory devices have been widely used.

FIG. 7 shows a conventional non-volatile memory of OTPROM as one kind of field programmable memories. A transistor 41 is formed on a silicon substrate 40. A third wiring 433 is formed on a third insulating layer 453. The third wiring 433 is connected to a conductive member 434, which is used for electrical input/output to each transistor. The third wiring 433 connects the transistors 41 to form a peripheral circuit. A non-volatile memory cell 42 is formed above a second insulating layer 452 so as to be insulated electrically from the transistor 41. The memory cell 42 includes a fuse insulation layer 47 and a conductive layer 46. Each memory cell is connected to a first wiring layer 431, connected to a reading line used for information reading operation, and to a second wiring layer 432, connected to a ground line. When electrical stress is applied to the fuse insulation layer 47 using the first and second wiring layers 431 and 432, the fuse insulation layer 47 would be broken. A permanent change of state would be occurred, so that a data-writing operation can be performed only once. Since the resistive value of the fuse insulation layer 47 varies depending on whether the fuse insulation layer 47 is broken or not, read date of "0" or "1" is determined based on the difference of the resistive value. Each memory cell of the OTPROM stores one bit date indicating two state information therein. [Patent Publication 1] P2002-530850A It has always been demanded that semiconductor memory devices are fabricated at lower cost and are provided with a higher density of integration regardless types of the memory devices. For OTPROM of non-volatile memory, wirings have got narrower and multiple-integrated to improve density of integration and to reduce fabrication costs. On the other hand, it takes a long time to entry such a high-integration memory device in the market. That is because it is required to change design rules and to reform or rebuild manufacturing equipments and plants in order to entry such a high-integration memory device in the market. Further, a reforming or rebuilding of manufacturing equipments and plants would cost much. For that reason, risks should be considered according to market trend for market entry. In order to obtain advantages against competitors, degree of integration of memory devices should be improved without renewal of manufacturing equipments and facilities.

OBJECTS OF THE INVENTION

Accordingly, an object of the present invention is to provide a non-volatile memory, which is fabricated to have a higher integration and a smaller chip area at a lower cost.

Another object of the present invention is to provide an improved method for fabricating a non-volatile memory, which allows a higher integration and a smaller chip area at a lower cost without reform or rebuilding of manufacturing equipments and plants.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

A first aspect of the present invention is applied to a non-volatile memory having a memory cell, storing predetermined data. According to the first aspect of the present invention, the memory cell comprises an upper electrode; a lower electrode and a state-variable region, in which a conductive state changes only once. The state variable region is formed in a region between the upper electrode and the lower electrode. The state-variable region comprises a first semiconductor layer of a first conductive type; and second semiconductor layers of a second conductive type, opposing to the first conductive type, which are formed on upper and lower surfaces of the first semiconductor layer via PN junctions.

A feature of the present invention is that a state-variable region includes two of PN junctions for each memory cell. The PN junctions are formed with a PNP diode or a NPN diode.

In the specification, "region between the upper electrode and the lower electrode" includes the upper electrode and the lower electrode themselves. The state-variable region may be formed at least a part of a region between the upper electrode and the lower electrode.

According to an aspect of the present invention, a PNP diode or an NPN diode is formed in a via-hole, formed in an interlayer insulating layer. At least one of the upper and lower electrodes may function concurrently with the second semiconductor layer. In this case, another second semiconductor layer may be shaped thinner or omitted.

If both the upper and lower electrodes function concurrently with the second semiconductor layers, only a first semiconductor layer may be formed in a via-hole. Preferably, p-type semiconductor is made of p-type poly-silicon, and n-type semiconductor is made of n-type poly-silicon.

According to the present invention, electrical stress is applied through the upper and lower electrodes so that two of the PN junctions form a braking condition (state) or a non-breaking condition (state). Those two different conditions (states) are stored or maintained as two-bit data, indicating four different states.

In the specification, “upper” and “lower” mean relative locations on a semiconductor substrate.

A second aspect of the present invention is applied to a method for writing data in a non-volatile memory cell array, which includes an upper electrode; a lower electrode; a first semiconductor layer of a first conductive type, which is formed in a region between the upper and lower electrodes; and second semiconductor layers of a second conductive type, opposing to the first conductive type, which are formed on upper and lower surfaces of the first semiconductor layer via PN junctions.

According to the second aspect of the present invention, the method comprises: a first voltage-applying step and a second voltage-applying step. In the first voltage-applying step, a voltage larger than a breakdown voltage of the PN junctions and a ground voltage are applied to the upper electrode and lower electrode. In the second voltage-applying step, a voltage larger than a breakdown voltage of the PN junctions and a ground voltage are applied to the upper electrode and lower electrode in the reverse direction relative to the first voltage-applying step.

Electrical stress is applied to each of the PN junctions, so that two of the PN junctions form a braking condition (state) or a non-breaking condition (state). Those two different conditions (states) are stored or maintained as two-bit data, indicating four different states.

A third aspect of the present invention is applied to a method for reading data out of a non-volatile memory cell array, which includes an upper electrode; a lower electrode; a first semiconductor layer of a first conductive type, which is formed in a region between the upper and lower electrodes; and second semiconductor layers of a second conductive type, opposing to the first conductive type, which are formed on upper and lower surfaces of the first semiconductor layer via PN junctions.

According to the third aspect of the present invention, a reading method comprises: a first current-detecting step and a second current-detecting step. In the first current detecting step, a voltage larger than a breakdown voltage of the PN junctions and a ground voltage are applied to the upper electrode and lower electrode; and an electrical current flowing through each memory cell is detected. In the second current-detecting voltage-applying step, a voltage larger than a breakdown voltage of the PN junctions and a ground voltage are applied to the upper electrode and lower electrode in the reverse direction relative to the first current-detecting step; and an electrical current flowing through each memory cell is detected.

According to a fourth aspect of the present invention, a method for fabricating a non-volatile memory, comprising:

forming a first insulating layer on a silicon substrate having a transistor;

forming a lower electrode layer on the first insulating layer;

forming a second insulating layer on the lower electrode layer;

forming a via hole in the second insulating layer so that the via hole is connected to the lower electrode layer;

forming a third semiconductor layer in the via hole;

forming a fourth semiconductor layer on the third semiconductor layer;

forming a fifth semiconductor layer on the fourth semiconductor layer, wherein the via hole is filled with the third to fifth semiconductor layers to form a state variable region; and forming an upper electrode layer on the second insulating layer so that the upper electrode layer is connected to the fifth semiconductor layer.

According to a fifth aspect of the present invention, a method for fabricating a non-volatile memory, comprising:

forming a first insulating layer on a silicon substrate having a transistor;

forming a lower electrode layer on the first insulating layer;

forming a third semiconductor layer on the lower electrode layer;

forming a fourth semiconductor layer on the third semiconductor layer;

forming a fifth semiconductor layer on the fourth semiconductor layer, wherein the third to fifth semiconductor layers form a layered semiconductor structure;

selectively etching the layered semiconductor structure to form a state-variable region;

forming an insulating layer on the lower electrode to surround the state-variable region; and forming an upper electrode layer on the insulating layer so that the upper electrode layer is connected to the fifth semiconductor layer.

According to a sixth aspect of the present invention, a method for fabricating a non-volatile memory, comprising:

forming a first insulating layer on a silicon substrate having a transistor;

forming a lower electrode layer on the first insulating layer;

forming a second insulating layer on the lower electrode layer;

forming a via-hole in the second insulating layer so that the via-hole is connected to the lower electrode layer;

filling the via-hole with a fourth semiconductor layer; and forming an upper electrode layer on the second insulating layer so that the upper electrode is connected to the fourth semiconductor layer.

According to the present invention, two bit data, indicating four different states, can be stored in each memory cell. On the other hand, according to a conventional non-volatile memory cell, only one bit data indicating two different states can be stored in each memory cell.

BRIEF DESCRIPTION OF THE DRAWINGS

FIG. 4 is a table showing variation (on or off) of electrical current flowing through a non-volatile memory for each operating state according to the preferred embodiment.

DESCRIPTION OF REFERENCE NUMERALS

Figure 1:
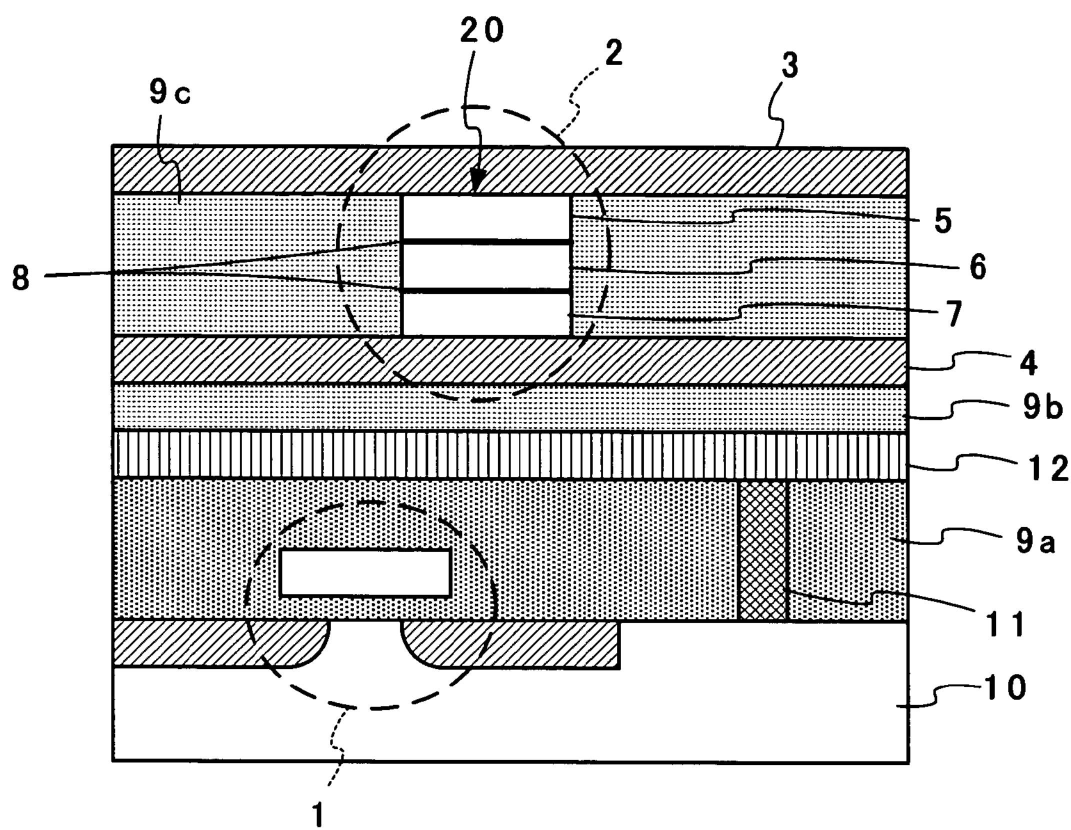
FIG. 1 is a cross-sectional view illustrating a semiconductor device including a non-volatile memory according to a preferred embodiment of the present invention.

1: transistor
2: memory cell
3, 23, 33: upper electrode (upper electrode wiring)
4, 24, 34: lower electrode (lower electrode wiring)
5, 6, 7, 26, 27, 36: poly-silicon
8, 8*a*, 8*b*, 28*a*, 28*b*, 38*a*, 38*b*: PN junction
9*a*, 9*b*, 9*c*, 29, 39: interlayer insulating layer
10: silicon substrate
11: connecting conductive member
12: input/output conductive line of transistor
20: via hole

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Now, preferred embodiments of the present invention will be described referring to the attached drawings. FIG. 1 shows a first preferred embodiment of the present invention, which includes a non-volatile memory cell and peripheral circuit elements. A non-volatile memory cell 2 includes an upper electrode layer 3, a lower electrode layer 4 and an interlayer insulating layer 9*c* (second insulating layer). The interlayer insulating layer 9*c* is provided with a via hole 20. A state-variable region is formed in the via-hole 20. The state-variable region is operable once. The state-variable region includes a PNP diode, having a couple of PN junctions 8.

The PNP diode includes a p-type poly-silicon layer 5 (first semiconductor layer), an n-type poly-silicon layer 6 (second semiconductor layer) and a p-type poly-silicon layer 7 (first semiconductor layer). PN junctions 8 are formed between the p-type poly-silicon layer 5 and n-type poly-silicon layer 6, and between the n-type poly-silicon layer 6 and p-type poly-silicon layer 7. A transistor 1, a connection conductor 11 and a transistor input/output conductive line 12 are formed below the memory cell via the interlayer insulating layer 9*b* (first insulating layer). The transistor 1 is formed on the silicon substrate 10. The connection conductor 11 forms a part of peripheral circuits.

Figure 2A:
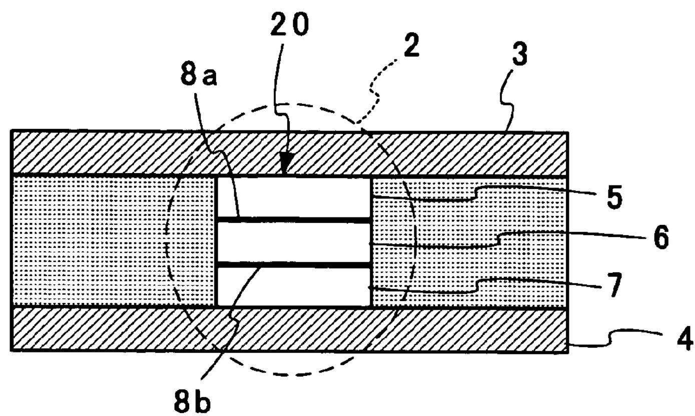
FIGS. 2A-2C are cross sectional views illustrating changes of state of a non-volatile memory according to the preferred embodiment.

Next, the detail of the state-variable region is described in conjunction with FIGS. 2 and 4. As shown in FIG. 1, a memory cell according to the present invention, a PNP diode is formed in the via hole 20, formed in the interlayer insulating layer between the upper and lower electrodes 3 and 4. At an initial state, the PN junctions 8 prohibit electric current flows in the opposite directions to each other through the PN junctions 8, as shown in FIG. 2A. In other words, electric current flows from p-semiconductor layer to n-semiconductor layer, since the opposite electric current does not flow from n-semiconductor layer to p-semiconductor layer.

Figure 2B:
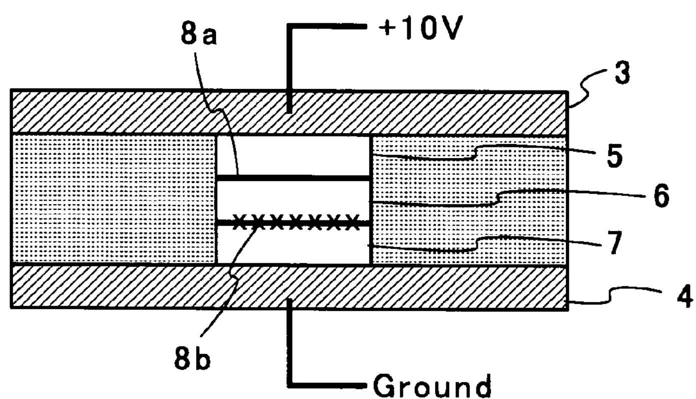

As shown in FIG. 2B, +10V of voltage is applied to the upper electrode 3, while the lower electrode 4 is grounded for at least one memory cell, which is required to be changed in state. In consequence, a voltage, which is larger than PN junction breakdown voltage, is applied to a lower PN junction 8*b* in the memory cell in a reverse direction from n-type semiconductor toward p-type semiconductor. When a voltage larger than the breakdown voltage is applied to the PN junction 8*b*, an over current flows through the PN junction 8*b*. If such an over current keeps flowing, the PN junction 8*b* would be broken by heat, and would turn in a stationary conductive state. The stationary conductive state is shown in FIG. 2B by an asterisked line. As a result, the PN junction 8*b* is turned in an irreversible state from the initial state, and therefore, an electric current could flow even at a voltage lower than the breakdown voltage in a direction from n-type semiconductor toward p-type semiconductor.

Figure 2C:
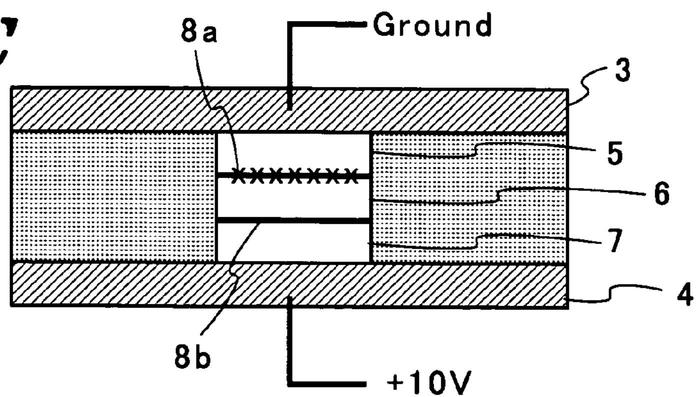

On the other hand, as shown in FIG. 2C, +10V of voltage is applied to the lower electrode 4, while the upper electrode 3 is grounded for at least one memory cell, which is required to be changed in state. In consequence, a voltage, which is larger than PN junction breakdown voltage, is applied to an upper PN junction 8*a* in the memory cell in a reverse direction from n-type semiconductor toward p-type semiconductor. When a voltage larger than the breakdown voltage is applied to the PN junction 8*a*, an over current flows through the PN junction 8*a*. If such an over current keeps flowing, the PN junction 8*a* would be broken by heat, and would turn in a stationary conductive state. The stationary conductive state is shown in FIG. 2C by an asterisked line. As a result, the PN junction 8*a* is turned in an irreversible state from the initial state, and therefore, an electric current could flow even at a voltage lower than the breakdown voltage in a direction from n-type semiconductor toward p-type semiconductor.

As described above, in a one-time programming of a non-volatile memory cell, a voltage which is larger than a breakdown voltage is applied at least once to one of the upper and lower electrodes. On the other hand, if no change of state is necessary, such a voltage that is larger than the breakdown voltage would not applied to the memory cell.

Figure 3:
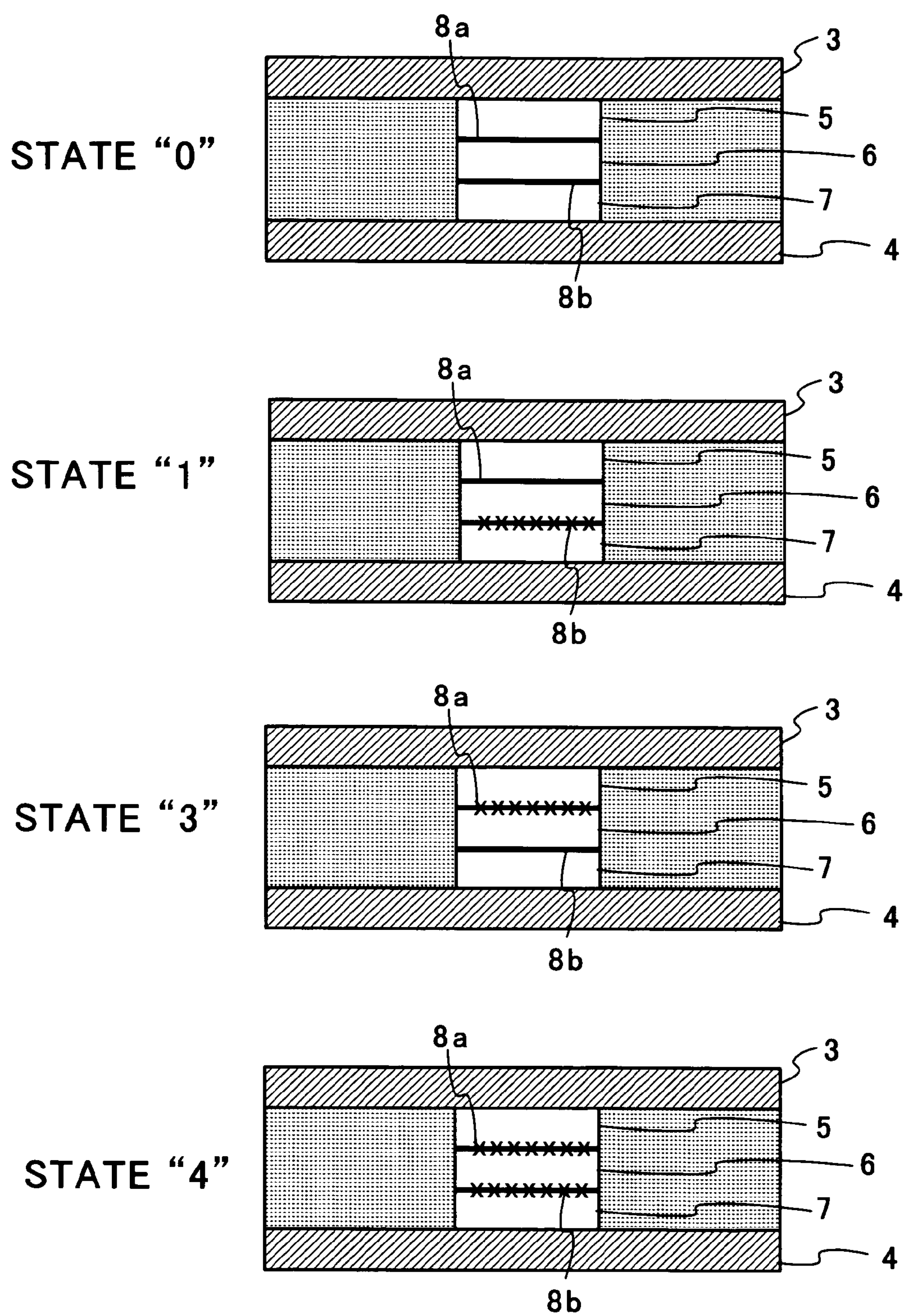
FIG. 3 includes cross sectional views illustrating operating states of a non-volatile memory according to the preferred embodiment.

FIG. 3 shows each state of a memory cell in a one-time programming process, in which the memory cell is irreversibly changed in state. In State "0", none of the upper electrode 3 and the lower electrode 4 is applied with a voltage, which has an enough level for changing the state of the memory cell. In State "1", only the upper electrode 3 is applied with a voltage that is larger than the PN junction breakdown voltage, as shown in FIG. 2B too. In State "2", only the lower electrode 4 is applied with a voltage that is larger than the PN junction breakdown voltage, as shown in FIG. 2C too. In State "3", both the upper and lower electrodes 3 and 4 are applied with a voltage that is larger than the PN junction breakdown voltage.

FIG. 4 is a table showing variation (on or off) of electrical current flowing through a memory cell when reading operation is performed for each operating state, shown in FIG. 3. The left vertical column shows states of current flowing under condition in that a +3V is applied to the upper electrode 3 and the lower electrode 4 is grounded. The right vertical column shows states of current flowing under condition in that a +3V is applied to the lower electrode 4 and the upper electrode 3 is grounded. In the table, "ON" and "OFF" indicates states in that current is flowing and current is not flowing, respectively. As shown in the table of FIG. 4, different conditions of electric current are described in the four operation states of "0" to "3". As a result, two bits of digital data can be stored in each memory cell.

According to the first preferred embodiment, two of upper and lower PN junctions 8*a* and 8*b* are formed in a single via-hole 20, and each of the PN junctions 8*a* and 8*b* has a breakdown voltage in a reverse voltage direction. Each of the PN junctions 8*a* and 8*b* can form broken state and non-broken state. As a result, the PN junctions 8*a* and 8*b* can store four patterns of information (two bits data) by turning on and off the PN junctions 8*a* and 8*b* selectively.

Figure 5:
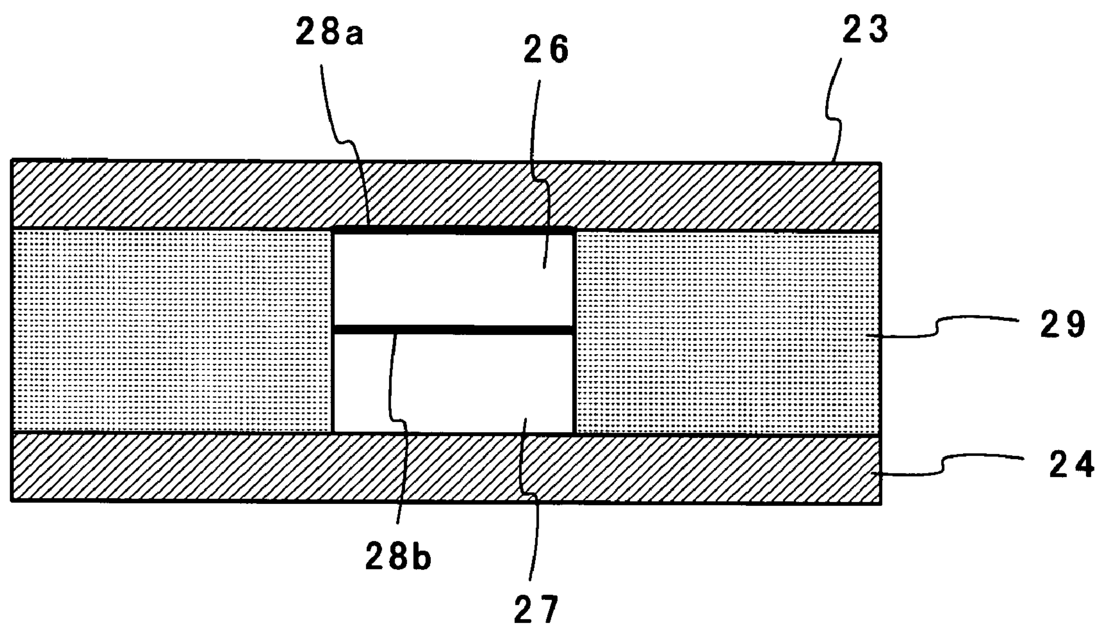
FIG. 5 is a cross sectional view illustrating a non-volatile memory according to another embodiment of the present invention.

FIG. 5 shows a second preferred embodiment of the present invention. According to the second preferred embodiment, an upper electrode 23 is made of p-type poly-silicon (second semiconductor). An interlayer insulation layer 29 is formed on a lower electrode layer 24, which is formed with a conventional conductive material. A via hole is formed in the interlayer insulation layer 29. A p-type poly-silicon layer 27 (second semiconductor) is formed in the via hole, and an n-type poly-silicon layer 26 (first semiconductor) is formed on the p-type poly-silicon layer 27.

According to the second preferred embodiment, a state-variable region includes a PN junction 28*a* and a PN junction 28*b*. The PN junction 28*a* is formed at a boundary between the upper electrode 23 and the via hole, while the other PN junction 28*b* is formed at a boundary between the p-type poly-silicon layer 27 and the n-type poly-silicon layer 26. Those two of the PN junctions 28*a* and 28*b* function in the same manner as those in the first preferred embodiment, and the same description is not repeated for avoiding redundancy. According to the second preferred embodiment, a total thickness of accumulated (layered) semiconductor layers becomes lower than the first preferred embodiment.

Figure 6:
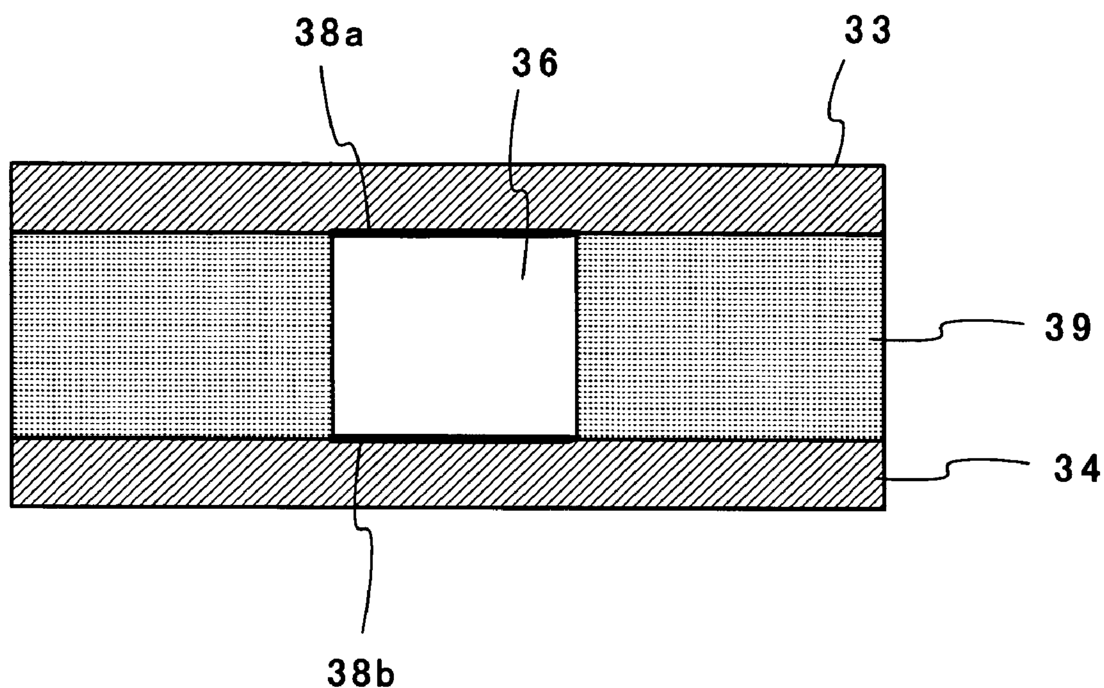
FIG. 6 is a cross sectional view illustrating a non-volatile memory according to still another embodiment of the present invention.
Figure 7:
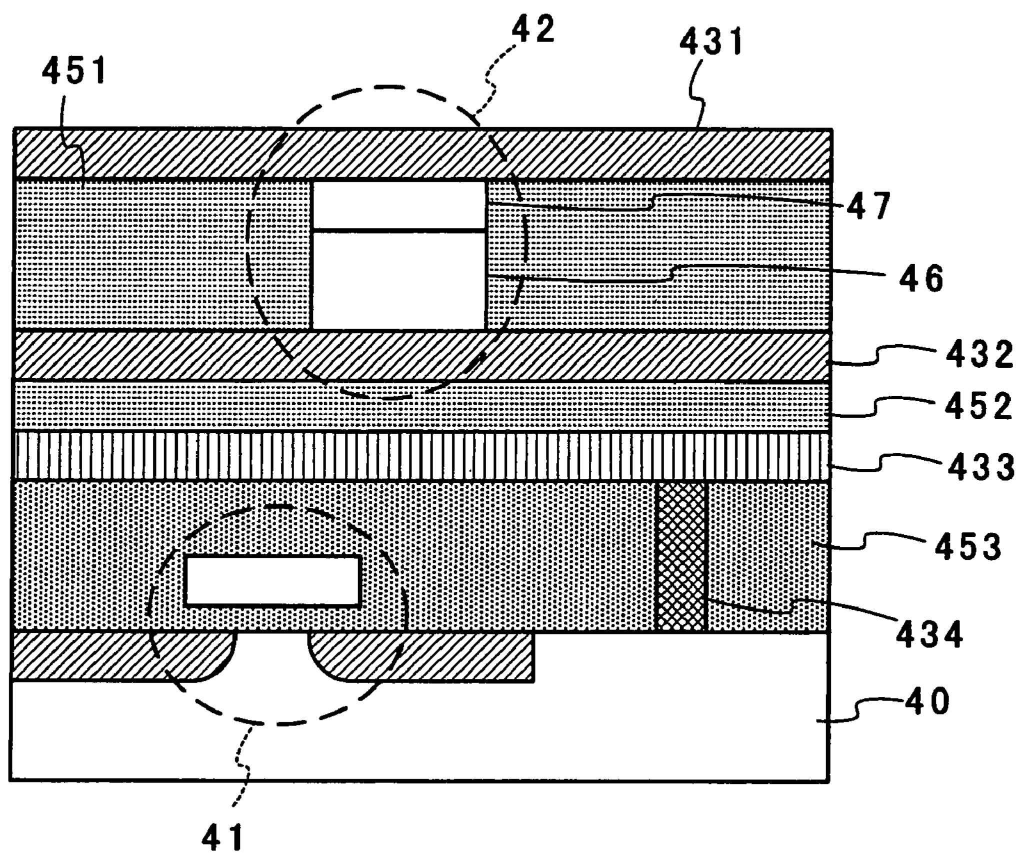
FIG. 7 is a cross-sectional view illustrating a semiconductor device including a conventional non-volatile memory.

FIG. 6 shows a third preferred embodiment of the present invention. According to the third preferred embodiment, both an upper electrode 33 and a lower electrode 34 are made of p-type poly-silicon (second semiconductor). An interlayer insulation layer 39 is formed on the lower electrode layer 34. A via hole is formed in the interlayer insulation layer 39 and is filled with an n-type poly-silicon (first semiconductor) 36.

According to the third preferred embodiment, a state-variable region includes PN junctions 38*a* and 38*b*. The PN junction 38*a* is formed at a boundary between the upper electrode 33 and the via hole, while the other PN junction 38*b* is formed at a boundary between the via hole and the lower electrode 34. Those two of the PN junctions 38*a* and 38*b* function in the same manner as those in the first preferred embodiment, and the same description is not repeated for avoiding redundancy. According to the third preferred embodiment, the number of layer-formation process is decreased and fabrication costs could be reduced.

Next, a method for fabricating a memory cell according to the first preferred embodiment, shown in FIG. 1, is described. A transistor 1 is formed on a silicon substrate 10 by a conventional method. An electrode (source or drain) of the transistor 1 is connected to an input/output conductive line 12 via a conductive member 11, which is formed in an interlayer insulation layer 9*a*. The transistor 1 and other transistor elements form a peripheral circuit by a conventional method. Another interlayer insulating layer 9*b* is formed as a first insulating layer on the input/output conductive line 12 by a well-known technology. A lower electrode layer 4 is formed on the interlayer insulation layer 9*b*, and another interlayer insulating layer 9*c* is formed as a second insulating layer on the lower electrode layer 4 by a conventional process. A via hole 20 is formed in the interlayer insulation layer 9*c* so that the via hole 20 is connected to the lower electrode layer 4.

A p-type poly-silicon layer 7 is formed in the via hole 20 by a CVD process using a boron of $5\times10^{18}/cm^3$ impurity concentration. After that, unnecessary poly-silicon, remained out of the via hole 20, is removed by an etching process. Next, an n-type poly-silicon layer 6 is formed on the p-type poly-silicon layer 7 by a CVD process using a phosphorus (P) of $5\times10^{18}/cm^3$ impurity concentration. After that, unnecessary poly-silicon, remained out of the via hole 20, is removed by an etching process. Subsequently, another p-type poly-silicon layer 5 is formed on the n-type poly-silicon layer 6 using a boron of $5\times10^{18}/cm^3$ impurity concentration. After that, unnecessary poly-silicon, remained out of the via hole 20, is removed by an etching process. Thus, the via hole 20 is filled with the three-layered poly-silicon (5-7) to form a PNP diode. Next, an upper electrode layer 3 is formed on the interlayer insulating layer 9*c* by a conventional process.

Now, another method for fabricating a memory cell, shown in FIG. 1, is described. A transistor 1 is formed on a silicon substrate 10 by a conventional method. An electrode (source or drain) of the transistor 1 is connected to an input/output conductive line 12 via a conductive member 11, which is formed in an interlayer insulation layer 9*a*. The transistor 1 and other transistor elements form a peripheral circuit by a conventional method. Another interlayer insulation layer 9*b* is formed as a first insulating layer on the input/output conductive line 12 by a well-known technology. A lower electrode layer 4 is formed on the interlayer insulation layer 9*b*.

Next, a p-type poly-silicon layer 7 is formed on the lower electrode layer by a CVD process using a boron of $5\times10^{18}/cm^3$ impurity concentration. Next, an n-type poly-silicon layer 6 is formed on the p-type poly-silicon layer 7 by a CVD process using a phosphorus (P) of $5\times10^{18}/cm^3$ impurity concentration. Subsequently, another p-type poly-silicon layer 5 is formed on the n-type poly-silicon layer 6 using a boron of $5\times10^{18}/cm^3$ impurity concentration. The p-type poly-silicon layer 7, n-type poly-silicon layer 6 and p-type poly-silicon layer 5 form a layered structure for a PNP diode.

After that, dot patterns are formed on the layered structure by conventional lithography process and etching process to form memory cells with PNP diodes. After the dot patterns are formed, an insulating layer is formed over the structure. Next, the insulating layer is polished by a CMP process to form (shape) an interlayer insulating layer 9*c* until the upper most p-type poly-silicon layer 5 is exposed. After the buried PNP diode memory cell is formed, an upper electrode layer 3 is formed on the interlayer insulating layer 9*c* by a conventional process. According to the above described method, a PNP layered structure for a diode is firstly formed, so that only one time etching process is carried out to shape the PNP diode.

Now, a method for fabricating a memory cell, shown in FIG. 5, is described. A transistor 1 is formed on a silicon substrate 10 by a conventional method. An electrode (source or drain) of the transistor 1 is connected to an input/output conductive line 12 via a conductive member 11, which is formed in an interlayer insulation layer 9*a*. The transistor 1 and other transistor elements form a peripheral circuit by a conventional method. Another interlayer insulation layer 9*b* is formed as a first insulating layer on the input/output conductive line 12 by a well-known technology.

After that, a lower electrode layer 24 is formed on the interlayer insulating layer 9*b* by a conventional process, then another interlayer insulating layer 29 is formed on the lower electrode layer 24 by a conventional process. A via hole is formed in the interlayer insulation layer 29 so that the vial hole is connected to the lower electrode layer 24 by a conventional process.

A p-type poly-silicon layer 27 is formed in the via hole by a CVD process using a boron of $5\times10^{18}/cm^3$ impurity concentration. After that, unnecessary poly-silicon, remained out of the via hole, is removed by an etching process. Next, an n-type poly-silicon layer 26 is formed on the p-type poly-silicon layer 27 by a CVD process using a phosphorus (P) of $5\times10^{18}/cm^3$ impurity concentration. After that, unnecessary poly-silicon, remained out of the via hole, is removed by an etching process. Thus, the via hole is filled with the two layered poly-silicon (26 and 27) to form a PN diode. Next, a p-type poly-silicon of an upper electrode layer 23 is formed on the interlayer insulating layer 29 by a conventional process using a boron of $5\times10^{18}/cm^3$ impurity concentration. PN junctions 28*a* and 28*b* are formed to keep state change of the memory cell. According to the above-described method, a diode has a two-layered structure, so that the number of fabrication steps is decreased and fabrication cost could be reduced.

Now, a method for fabricating a memory cell, shown in FIG. 6, is described. A transistor 1 is formed on a silicon substrate 10 by a conventional method. An electrode (source or drain) of the transistor 1 is connected to an input/output conductive line 12 via a conductive member 11, which is formed in an interlayer insulation layer 9*a*. The transistor 1 and other transistor elements form a peripheral circuit by a conventional method. Another interlayer insulation layer 9*b* is formed as a first insulating layer on the input/output conductive line 12 by a well-known technology.

After that, a lower electrode layer 34 of p-type poly-silicon is formed on the interlayer insulating layer 9*b* by a conventional process using a boron of $5\times10^{18}/cm^3$ impurity concentration. Next, another interlayer insulating layer 39 is formed on the lower electrode layer 34 by a conventional process. A via hole is formed in the interlayer insulation layer 39 so that the via hole is connected to the lower electrode layer 34 by a conventional process.

An n-type poly-silicon layer 36 is formed in the via hole by a CVD process using a phosphorus (P) of $5\times10^{18}/cm^3$ impurity concentration. After that, unnecessary poly-silicon, remained out of the via hole, is removed by an etching process so that the via hole is filled with the n-type poly-silicon layer 36. Next, a p-type poly-silicon of an upper electrode layer 33 is formed on the interlayer insulating layer 39 by a conventional process using a boron of $5\times10^{18}/cm^3$ impurity concentration. PN junctions 38*a* and 38*b* are formed to keep state change of the memory cell. According to the above-described method, the number of layer-formation process is decreased and fabrication costs could be reduced.

According to the present invention, p-type semiconductor and n-type semiconductor can be replaced by each other by controlling polarity of voltage applied thereto.

What is claimed is:

1. A non-volatile memory cell to store data, comprising:

an upper electrode and a lower electrode; and a state-variable region, in which a conductive state changes permanently, the state variable region being disposed between and in electrical contact with each of the upper electrode and the lower electrode, wherein the state-variable region comprises a first semiconductor layer of a first conductive type and second semiconductor layers of a second conductive type on either side of the first semiconductor layer in a direction of current flow through the state-variable region, which form on upper and lower surfaces of the first semiconductor layer two PN junctions of opposite polarity orientations;

whereby the memory cell has four possible states depending on which of the two PN junctions has been broken and not broken, and two bits of data are storable in the memory cell.

2. The non-volatile memory according to claim 1, wherein at least one of the upper and lower electrodes comprises the second semiconductor layer.

3. The non-volatile memory according to claim 1, wherein the second semiconductor layer is of a poly-silicon of p-type or n-type.

4. The non-volatile memory according to claim 1, comprising insulation disposed between the upper electrode and the lower electrode, and wherein the state-variable region is disposed within a via hole in the insulation.

5. The non-volatile memory according to claim 1, wherein the state variable region is in direct contact with each of the upper electrode and the lower electrode.

6. The non-volatile memory according to claim 1, wherein the state variable region consists of the first conductive layer and the two second semiconductor layers of a second conductive type on either side of the first semiconductor layer in the direction of current flow through the state-variable region, which form on the upper and lower surfaces of the first semiconductor layer the two PN junctions of opposite polarity orientations.

7. The non-volatile memory according to claim 6, comprising insulation disposed between the upper electrode and the lower electrode, and wherein the state-variable region is disposed within a via hole in the insulation.

8. The non-volatile memory according to claim 6, wherein the state variable region is in direct contact with each of the upper electrode and the lower electrode.

9. The non-volatile memory according to claim 6, wherein at least one of the upper and lower electrodes comprises the second semiconductor layer.

* * * * *